(12) United States Patent
Cooper

(10) Patent No.: US 6,188,333 B1
(45) Date of Patent: *Feb. 13, 2001

(54) LZW DATA COMPRESSION APPARATUS AND METHOD USING LOOK-AHEAD MATHEMATICAL RUN PROCESSING

(75) Inventor: Albert B. Cooper, New York, NY (US)

(73) Assignee: Unisys Corporation, Blue Bell, PA (US)

( * ) Notice: Under 35 U.S.C. 154(b), the term of this patent shall be extended for 0 days.

This patent is subject to a terminal disclaimer.

(21) Appl. No.: 09/372,483

(22) Filed: Aug. 12, 1999

(51) Int. Cl.[7] .................................................. H03M 7/34
(52) U.S. Cl. ................................................. 341/51; 341/63
(58) Field of Search .................................. 341/50, 51, 63, 341/65, 67

(56) References Cited

U.S. PATENT DOCUMENTS

| | | | |
|---|---|---|---|
| 4,558,302 | * 12/1985 | Welch | 341/51 |
| 4,929,946 | 5/1990 | O'Brien et al. | 341/87 |
| 4,971,407 | 11/1990 | Hoffman | 341/87 |
| 4,988,998 | 1/1991 | O'Brien | 341/55 |
| 5,247,638 | 9/1993 | O'Brien et al. | 395/425 |
| 5,369,605 | * 11/1994 | Parks | 364/715.09 |
| 5,389,922 | 2/1995 | Seroussi et al. | 341/51 |
| 5,448,733 | * 9/1995 | Satoh et al. | 395/600 |
| 5,463,390 | * 10/1995 | Whitting et al. | 341/51 |
| 5,525,982 | * 6/1996 | Cheng et al. | 341/51 |
| 5,610,603 | * 3/1997 | Plambeck | 341/51 |
| 5,764,167 | * 6/1998 | Adams et al. | 341/63 |
| 5,798,718 | * 8/1998 | Hadady | 341/51 |
| 5,861,827 | * 1/1999 | Welch et al. | 341/51 |

OTHER PUBLICATIONS

Internet site: http://www.boutell.com/gd. pp. 1–2.

* cited by examiner

Primary Examiner—Peguy JeanPierre
(74) Attorney, Agent, or Firm—Albert B. Cooper; Mark T. Starr; Rocco L. Adornato

(57) ABSTRACT

The disclosed data compressor compresses an input stream of data characters using LZW data compression. When the occurrence of a run of input data characters is detected, the run is processed by successively looking ahead into the input to determine the contiguous numerically increasing segments that exist in the run and by utilizing codes from the compressor code counter to correspond to the contiguous numerically increasing run segments. Alternatively, the detected run is processed by determining the length of the run and mathematically determining, from the length of the run, the respective codes from the code counter corresponding to the contiguous numerically increasing segments that exist in the run. Specifically, an iterative mathematical algorithm or a quadratic equation algorithm are utilized to process the run.

58 Claims, 9 Drawing Sheets

RUN PROCESSING

INPUT DATA CHARACTER STREAM

$a_1\ b_1\ a_2\ b_2\ a_3\ b_3\ a_4\ a_5\ a_6\ \ldots\ a_{17}\ b_1\ b_2\ b_3\ \ldots\ b_{10}\ c\ d\ x$

| ACT-IONS | CURR MATCH | CURR CHAR | n | LOOK-AHEAD CHARS | DICT CODE | DICT CHAR | OUT-PUT | CODE CNTR | DISCARD CHARS | BLOCKS OF FIGS. 2 & 3 |
|---|---|---|---|---|---|---|---|---|---|---|
| 1 |  | $a_1$ | 2 | $b_1\ a_2$ |  |  |  | 258 |  | 40–44 |
| 2 | $a_1$ | $b_1$ |  | $a_2\ b_2$ | $a_1$ | $b_1$ | $a_1$ |  |  | 46,47,50,52,53 |
| 3 | $b_1$ | $a_2$ |  | $b_2\ a_3$ | $b_1$ | $a_2$ | $b_1$ | 259 |  | 54–56,44,46,47,50,52,53 |
| 4 | $a_2$ | $b_2$ |  |  |  |  |  | 260 |  | 54–56,44,46,47,50 |
| 5 | 258 | $a_3$ |  | $b_3\ a_4$ | 258 | $a_3$ | 258 |  |  | 51,47,50,52,53 |
| 6 | $a_3$ | $b_3$ |  |  |  |  |  | 261 |  | 54–56,44,46,47,50 |
| 7 | 258 | $a_4$ |  |  |  |  |  |  |  | 51,47,50 |
| 8 | 260 | $a_5$ |  | $a_6\ a_7$ | 260 | $a_5$ | 260 |  |  | 51,47,50,52,53 |
| 9 |  |  |  |  |  |  | $a_5$ | 262 |  | 54–56,44,45,60 |
| 10 |  |  | 3 | $a_8$–$a_{10}$ |  |  | 262 | 263 | $a_6\ a_7$ | 61–67 |
| 11 |  |  | 4 | $a_{11}$–$a_{14}$ |  |  | 263 | 264 | $a_8$–$a_{10}$ | 61–67 |
| 12 |  |  | 5 | $a_{15}$–$a_{17}$ $b_1\ b_2$ |  |  | 264 | 265 | $a_{11}$–$a_{14}$ | 61–67 |
| 13 |  | $a_{15}$ | 2 | $a_{16}\ a_{17}$ |  |  | $a_{15}$ | 266 |  | 70–73,43–45,60 |
| 14 |  |  | 3 | $b_1$–$b_3$ |  |  | 266 | 267 | $a_{16}\ a_{17}$ | 61–67 |
| 15 |  | $b_1$ | 2 | $b_2\ b_3$ |  |  | $b_1$ | 268 |  | 70–73,43–45,60 |
| 16 |  |  | 3 | $b_4$–$b_6$ |  |  | 268 | 269 | $b_2\ b_3$ | 61–67 |
| 17 |  |  | 4 | $b_7$–$b_{10}$ |  |  | 269 | 270 | $b_4$–$b_6$ | 61–67 |
| 18 |  |  | 5 | $c\ d\ x\ ..$ |  |  | 270 | 271 | $b_7$–$b_{10}$ | 61–67 |
| 19 |  | $c$ | 2 | $d\ x$ |  |  |  | 272 |  | 70–73,43,44 |
| 20 | $c$ | $d$ |  | $x\ ..$ | $c$ | $d$ | $c$ |  |  | 46,47,50,52,53 |
| 21 | $d$ | $x$ |  | $\ldots$ | $d$ | $x$ | $d$ | 273 |  | 54–56,44,46,47,50,52,53 |
| 22 |  |  |  |  |  |  |  | 274 |  | 54–56 |

*Figure 4*

RUN PROCESSING

INPUT DATA CHARACTER STREAM

$a_1\ b_1\ a_2\ b_2\ a_3\ b_3\ a_4\ a_5\ a_6\ ....\ a_{17}\ b_1\ b_2\ b_3\ ...\ b_{10}\ c\ d\ x$

| ACT-IONS | CURR MATCH | CURR CHAR | DICT CODE | DICT CHAR | OUT-PUT | CODE CNTR | LOOK-AHEAD CHARS | R | n | D | DISCARD CHARS | BLOCKS OF FIGS. 2 & 6 |
|---|---|---|---|---|---|---|---|---|---|---|---|---|
| 1 |  | $a_1$ |  |  |  | 258 | $b_1 a_2$ |  | 2 |  |  | 40–44 |
| 2 | $a_1$ | $b_1$ | $a_1$ | $b_1$ | $a_1$ |  | $a_2 b_2$ |  |  |  |  | 46,47,50,52,53 |
| 3 | $b_1$ | $a_2$ | $b_1$ | $a_2$ | $b_1$ | 259 | $b_2 a_3$ |  |  |  |  | 54–56,44,46,47,50,52,53 |
| 4 | $a_2$ | $b_2$ |  |  |  | 260 |  |  |  |  |  | 54–56,44,46,47,50 |
| 5 | 258 | $a_3$ | 258 | $a_3$ | 258 |  | $b_3 a_4$ |  |  |  |  | 51,47,50,52,53 |
| 6 | $a_3$ | $b_3$ |  |  |  | 261 |  |  |  |  |  | 54–56,44,46,47,50 |
| 7 | 258 | $a_4$ |  |  |  |  |  |  |  |  |  | 51,47,50 |
| 8 | 260 | $a_5$ | 260 | $a_5$ | 260 |  | $a_6 a_7$ |  |  |  |  | 51,47,50,52,53 |
| 9 |  |  |  |  | $a_5$ | 262 |  | 12 | 2 | 0 |  | 54–56,44,45,100–104 |
| 10 |  |  |  |  | 262 | 263 |  | 10 | 3 | 2 |  | 105–111,104 |
| 11 |  |  |  |  | 263 | 264 |  | 7 | 4 | 5 |  | 105–111,104 |
| 12 |  |  |  |  | 264 | 265 |  | 3 | 5 | 9 |  | 105–111,104 |
| 13 |  |  |  |  | $a_5$ | 266 |  | 2 | 2 | 10 |  | 120–127,104 |
| 14 |  |  |  |  | 266 | 267 |  | 0 | 3 | 12 | $a_6$–$a_{17}$ | 105–111,104,120,130 |
| 15 |  | $b_1$ |  |  | $b_1$ | 268 | $b_2 b_3$ | 9 | 2 | 0 |  | 131–134,43–45,100–104 |
| 16 |  |  |  |  | 268 | 269 |  | 7 | 3 | 2 |  | 105–111,104 |
| 17 |  |  |  |  | 269 | 270 |  | 4 | 4 | 5 |  | 105–111,104 |
| 18 |  |  |  |  | 270 | 271 |  | 0 | 5 | 9 | $b_2$–$b_{10}$ | 105–111,104,120,130 |
| 19 |  | c |  |  |  | 272 | d x |  | 2 |  |  | 131–134,43,44 |
| 20 | c | d | c | d | c |  | x . |  |  |  |  | 46,47,50,52,53 |
| 21 | d | x | d | x | d | 273 | . . |  |  |  |  | 54–56,44,46,47,50,52,53 |
| 22 |  |  |  |  |  | 274 |  |  |  |  |  | 54–56 |

*Figure 7*

RUN PROCESSING

INPUT DATA CHARACTER STREAM

$a_1\ b_1\ a_2\ b_2\ a_3\ b_3\ a_4\ a_5\ a_6\ \ldots\ a_{17}\ b_1\ b_2\ b_3\ \ldots\ b_{10}\ c\ d\ x$

| ACT-IONS | CURR MATCH | CURR CHAR | DICT | | OUT-PUT | CODE CNTR | LOOK-AHEAD CHARS | R | n | D | T | L | DIS-CARD CHARS | BLOCKS OF FIGS. 2 & 9 |
|---|---|---|---|---|---|---|---|---|---|---|---|---|---|---|
| | | | CODE | CHAR | | | | | | | | | | |
| 1 | | $a_1$ | | | | 258 | $b_1\ a_2$ | 2 | | | | | | 40–44 |
| 2 | $a_1$ | $b_1$ | $a_1$ | $b_1$ | $a_1$ | | $a_2\ b_2$ | | | | | | | 46,47,50,52,53 |
| 3 | $b_1$ | $a_2$ | $b_1$ | $a_2$ | $b_1$ | 259 | $b_2\ a_3$ | | | | | | | 54–56,44,46,47,50,52,53 |
| 4 | $a_2$ | $b_2$ | | | | 260 | | | | | | | | 54–56,44,46,47,50 |
| 5 | 258 | $a_3$ | 258 | $a_3$ | 258 | | $b_3\ a_4$ | | | | | | | 51,47,50,52,53 |
| 6 | $a_3$ | $b_3$ | | | | 261 | | | | | | | | 54–56,44,46,47,50 |
| 7 | 258 | $a_4$ | | | | | | | | | | | | 51,47,50 |
| 8 | 260 | $a_5$ | 260 | $a_5$ | 260 | | $a_6\ a_7$ | | | | | | | 51,47,50,52,53 |
| 9 | | | | | $a_5$ | 262 | | 13 | 4 | 0 | 10 | 265 | | 54–56,44,45,160–165 |
| 10 | | | | | 262 | 263 | | | 9 | | | | | 166,170–174 |
| 11 | | | | | 263 | 264 | | | | | | | | 170–174 |
| 12 | | | | | 264 | 265 | | 3 | | 10 | | | | 170–174,180–182 |
| 13 | | | | | $a_5$ | 266 | | 2 | | 12 | 3 | 267 | | 183–186,163–166 |
| 14 | | | | | 266 | 267 | | 0 | | | | | $a_6$–$a_{17}$ | 170–174,180,181,190 |
| 15 | | $b_1$ | | | $b_1$ | 268 | $b_2\ b_3$ | 10 | 2 | 0 | | | | 191–194,43–45,160–162 |
| 16 | | | | | 268 | 269 | | | 4 | 9 | 10 | 271 | | 163–166,170–174 |
| 17 | | | | | 269 | 270 | | | | | | | | 170–174 |
| 18 | | | | | 270 | 271 | | 0 | | | | | $b_2$–$b_{10}$ | 170–174,180,181,190 |
| 19 | | c | | | | 272 | d x | 2 | | | | | | 191–194,43,44 |
| 20 | c | d | c | d | c | | x . | | | | | | | 46,47,50,52,53 |
| 21 | d | x | d | x | d | 273 | . . | | | | | | | 54–56,44,46,47,50,52,53 |
| 22 | | | | | | 274 | | | | | | | | 54–56 |

*Figure 10*

LZW DATA COMPRESSION APPARATUS AND METHOD USING LOOK-AHEAD MATHEMATICAL RUN PROCESSING

CROSS REFERENCE TO RELATED APPLICATIONS

U.S. patent application Ser. No. 09/264,269 by Cooper, filed Mar. 8, 1999, entitled "Data Compression Method And Apparatus With Embedded Run-Length Encoding".

U.S. patent application Ser. No. 09/300,810 by Cooper, filed Apr. 27, 1999, entitled "Data Compression Method And Apparatus With Embedded Run-Length Encoding Using Mathematical Run Processing".

U.S. patent application Ser. No. 09/336,219 by Cooper, filed Jun. 19, 1999, entitled "LZW Data Compression/Decompression Apparatus And Method With Embedded Run-Length Encoding/Decoding".

Said patent applications Ser. Nos. 09/264,269; 09/300,810 and 09/336,219 are incorporated herein by reference.

BACKGROUND OF THE INVENTION

1. Field of the Invention

The invention relates to LZW data compression particularly with respect to minimizing dictionary access when processing character runs.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW, adopted as the standard for V.42 bis modem compression and decompression, is described in U.S. Pat. No. 4,558,302 by Welch, issued Dec. 10, 1985. LZW has been adopted as the compression and decompression standard used in the GIF and TIFF image communication protocols.

Further examples of LZ dictionary based compression and decompression systems are described in the following U.S. patents: U.S. Pat. No. 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; and U.S. Pat. No. 5,373,290 by Lempel et al., issued Dec. 13, 1994.

Another type of data compression and decompression, denoted as run-length encoding (RLE), compresses a repeating character run by providing a compressed code indicating the character and the length of the run. RLE is thus effective in encoding long strings of the same character. For example, RLE is effective in compressing a long sequence of blanks that may be included at the beginning of a data file. RLE is also effective in image compression where an image contains a long run of consecutive pixels having the same value, such as in the sky portion of a land-sky image.

When the above dictionary based LZ compression systems encounter a character run, numerous dictionary accesses are utilized to generate the compressed codes corresponding to the run. It is desirable in such systems to minimize the number of dictionary accesses so as to enhance system performance.

In the prior art, run-length encoding has been combined with LZ systems as exemplified in the following U.S. patents: U.S. Pat. No. 4,929,946 by O'Brien et al., issued May 29, 1990; U.S. Pat. No. 4,971,407 by Hoffman, issued Nov. 20, 1990; U.S. Pat. No. 4,988,998 by O'Brien, issued Jan. 29, 1991; U.S. Pat. No. 5,247,638 by O'Brien et al., issued Sep. 21, 1993; U.S. Pat. No. 5,389,922 by Seroussi et al., issued Feb. 14, 1995; and U.S. Pat. No. 5,861,827 by Welch et al., issued Jan. 19, 1999.

In some prior art systems, run-length encoding has been combined with an LZ system by applying the data to a run-length encoder and then applying the run-length encoded data to the LZ based system. In such an architecture, a run-length encoder is utilized at the front end of the compressor and a run-length decoder is utilized at the output end of the decompressor. Such a system suffers from the disadvantages of increased equipment, expense, control overhead and processing time. U.S. Pat. Nos. 4,971,407 and 4,988,998 exemplify such a system.

In the LZW based system of U.S. Pat. No. 5,389,922, certain output codes from the compressor are suppressed in the presence of a run of repeating input data characters but numerous dictionary accesses are nevertheless utilized. A special run enhancement engine is required at the input to the decompressor to regenerate the missing codes.

In the compressor of the system of U.S. Pat. No. 5,861,827, when a partial string W and a character C are found, a new string is stored with C as an extension character on the string PW where P was the string conveyed in the last transmitted output compressed code. With this compression algorithm, a run of characters is encoded in two compressed codes regardless of its length but, nevertheless, numerous dictionary accesses are utilized. The decompressor of this system uses a special unrecognized code process to maintain synchronism with the compressor.

In the system of U.S. Pat. No. 4,929,946, a run is indicated by transmitting a predetermined reserved reference value followed by a repeat count for the run. The requirement of the use of the reserved reference value in the compressed stream for every run that is detected tends to reduce the compression. U.S. Pat. No. 5,247,638 provides descriptions similar to those of U.S. Pat. No. 4,929,946.

Another data compression system involving the encoding of data character runs is disclosed in said patent application Ser. No. 09/264,269. In the compressor of this patent application, runs are processed by successively looking ahead into the input to determine if contiguous numerically increasing segments exist in the run.

Another data compression system involving the encoding of data character runs is disclosed in said patent application Ser. No. 09/300,810. In the compressor of this patent application, runs are processed by mathematically determining, from the length of the run, the respective output codes corresponding to the contiguous numerically increasing segments that exist in the run.

Another data compression and decompression system that involves the processing of data character runs is disclosed in said patent application Ser. No. 09/336,219. In the system of this patent application, run-length encoding/decoding is embedded in the LZW data compression/decompression system where the compressor and decompressor code counters are utilized in signalling and detecting that a character run has been encountered.

It is an object of the present invention to detect the presence of a character run in an LZW data compression system and to variously utilize run processing procedures described in said patent applications Ser. No. 09/264,269 and Ser. No. 09/300,810 to process the run. Since these run processing procedures do not require numerous dictionary accesses, a performance improvement is effected.

SUMMARY OF THE INVENTION

The present invention enhances the well-known LZW data compression system by determining when a run of input data characters is about to occur. The run is processed by successively looking ahead into the input to determine if contiguous numerically increasing segments exist in the run and by generating a sequence of numerically increasing output codes corresponding to the numerically increasing contiguous run segments. Alternatively, the run is processed by determining the length of the run and mathematically determining, from the length of the run, the respective output codes corresponding to the contiguous numerically increasing segments that exist in the run. Specifically, an iterative mathematical algorithm or a quadratic equation algorithm are utilized to process the run.

BRIEF DESCRIPTION OF THE DRAWINGS

FIG. 4 is a chart exemplifying the operations of the compressor of FIG. 1 in accordance with the control flow charts of FIGS. 2 and 3.

FIG. 7 is a chart exemplifying the operations of the compressor of FIG. 5 in accordance with the control flow charts of FIGS. 2 and 6.

FIG. 10 is a chart exemplifying the operations of the compressor of FIG. 8 in accordance with the control flow charts of FIGS. 2 and 9.

DESCRIPTION OF THE PREFERRED EMBODIMENTS

Figure 1:
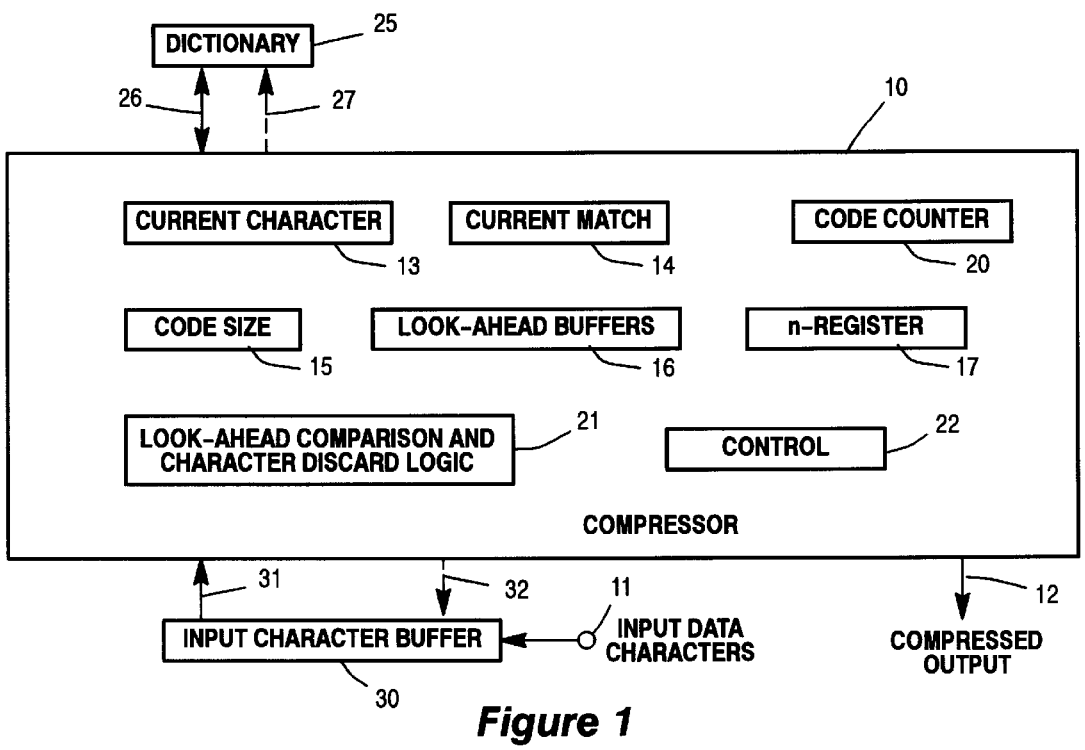
FIGS. 1, 5 and 8 are schematic block diagrams of data compressors providing alternative preferred embodiments of the present invention.

Referring to FIG. 1, a data compressor 10 is illustrated that compresses a stream of input data characters applied at an input 11 into a stream of corresponding compressed codes at an output 12. The compressor 10 includes working registers denoted as a Current Character register 13, a Current Match register 14, a Code Size register 15, Look-Ahead Buffers 16 and an n-register 17. The compressor 10 further includes a Code Counter 20 for sequentially generating code values that are used to process run segments and non-run character strings in a manner to be described.

The compressor 10 further includes look-ahead comparison and character discard logic 21. The logic 21 performs comparisons between a character in the Current Character register 13 and the characters in the Look-Ahead Buffers 16 and discards look-ahead characters in a manner to be described. The logic 21 also performs comparisons between the character in the Current Character register 13 and characters in the Look-Ahead Buffers 16 to determine if a run is about to commence in a manner to be further explained. The compressor 10 also includes control 22 for controlling the operations of the compressor in accordance with the operational flow charts of FIGS. 2 and 3 in a manner to be described.

Also included is a Dictionary 25 for storing character strings in cooperation with the compressor 10 in a manner to be described. Data is communicated between the compressor 10 and the Dictionary 25 via a bi-directional data bus 26 under control of a control bus 27.

Further included is an Input Character Buffer 30 that buffers the input data character stream received at the input 11. The individual input data characters are applied from the Input Character Buffer 30 via a bus 31 to the Current Character register 13 and the Look-Ahead Buffers 16 in accordance with operations to be described. The compressor 10 controls acquiring input data characters from the Input Character Buffer 30 via a control bus 32.

Briefly, the operation of the compressor 10 is as follows. Input data characters are fetched from the Input Character Buffer 30 and when run processing is not in effect conventional LZW data compression is performed providing a compressed code stream at the output 12. In LZW data compression, in a well known manner, the Code Counter 20 is progressively incremented to assign code values to extended strings that are stored in the Dictionary 25. The compressor 10 is described herein in terms of a variable length code as is well understood in the art. The Current Character register 13, the Current Match register 14, the Code Size register 15, the Code Counter 20 and the Dictionary 25 are utilized in performing the LZW data compression. The LZW data compression algorithm is described in detail in said U.S. Pat. No. 4,558,302.

Using the Look-Ahead Buffers 16 and the logic 21, consecutive input characters are examined and if the next 2 look-ahead characters are the same as the character in the Current Character register 13, the LZW process diverts to run processing. The run processing utilized is that described in said patent application Ser. No. 09/264,269. Briefly, if a character run is detected, the character beginning the run, residing in the Current Character register 13, and the code in the Code Counter 20 are output. The Code Counter 20 is then incremented by 1. The run is then examined to determine if numerically increasing run segments exist in the run. Specifically, it is determined if contiguous run segments of 3 characters, 4 characters, 5 characters, 6 characters etc., exist in the run following the two look-ahead characters that follow and match the character in the Current Character register 13. For each such detected run segment, the code in the Code Counter 20 is output and the Code Counter 20 is incremented by 1. The process is continued until insufficient characters remain in the run to populate the next run segment in the sequence. When this occurs, the Code Counter 20 is again advanced by 1.

The Current Character register 13, the Code Size register 15, the Look-Ahead Buffers 16, the n-register 17, the Code Counter 20 and the logic 21 are utilized in performing the character run processing as described below with respect to FIGS. 2 and 3. The control 22 is considered as containing appropriate circuitry such as state machines to control execution of the operations.

The embodiments described below are, for purposes of explanation, exemplified in ASCII implementations. The ASCII environment utilizes an 8 bit character size supporting an alphabet of 256 characters.

Figure 2:
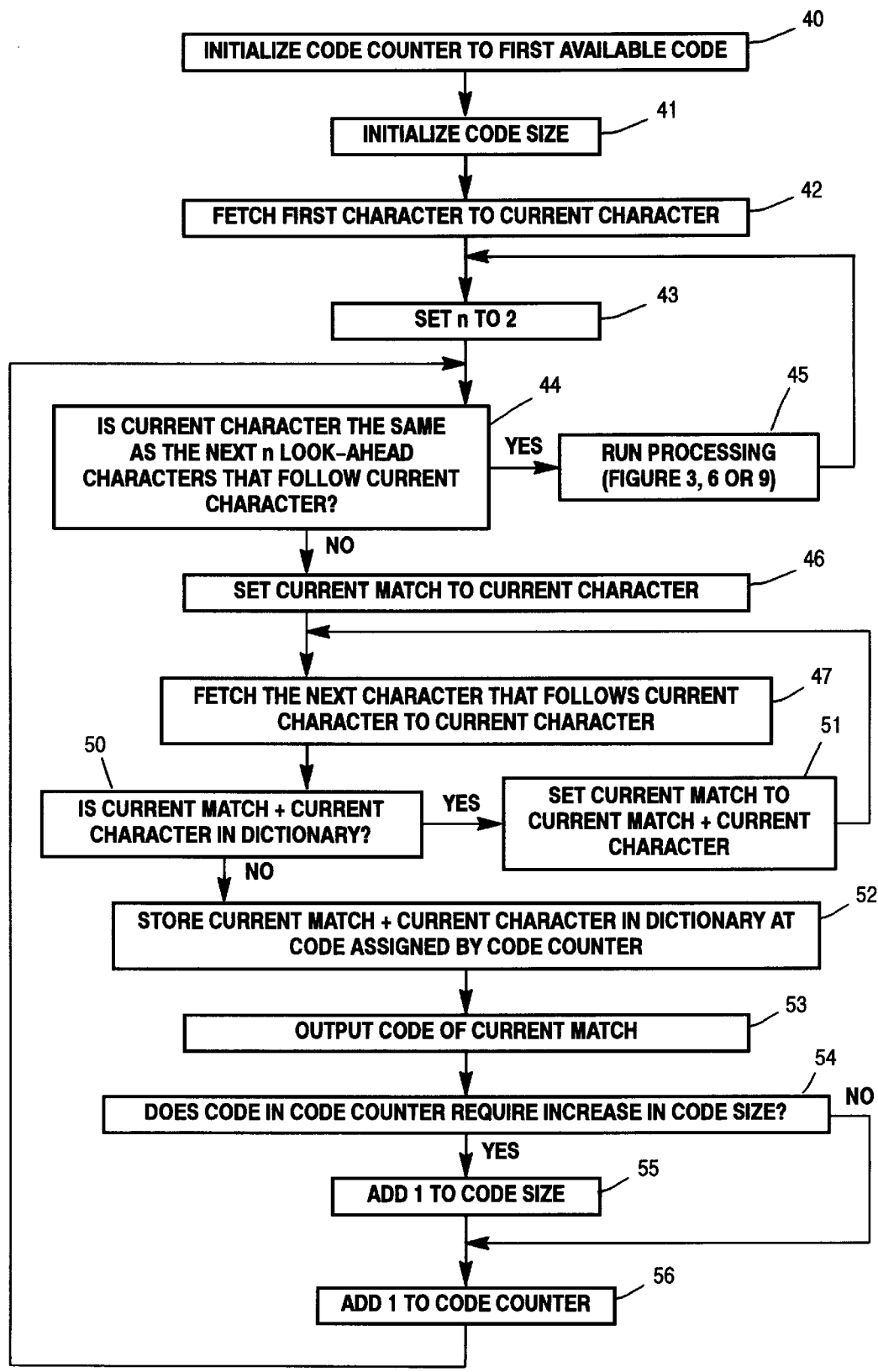
FIG. 2 is a control flow chart illustrating the operations executed by the compressors of FIGS. 1, 5 and 8 so as to perform data compression in accordance with the present invention.

Referring to FIG. 2, with continued reference to FIG. 1, a control flow chart is illustrated showing the detailed operations to be executed by the compressor 10. The flow chart of FIG. 2 is predicated on a variable length output and the Code Size register 15 is utilized to this effect. In an ASCII variable length code implementation, the Code Size may begin with 9 bits and sequentially increase to 10, 11, 12, etc., bits at codes 512, 1024, 2048, etc., respectively.

Accordingly, at a block 40, the Code Counter 20 is initialized to a first available code, for example, 258 in the ASCII environment. At a block 41, the Code Size register 15 is initialized to the beginning Code Size, for example, 9 bits in the ASCII embodiments. At a block 42, the first input character is fetched into Current Character register 13 and at a block 43, the n-register 17 is set to 2.

Processing continues at a block 44 wherein the Current Character in the register 13 is tested against the next n look-ahead characters that follow Current Character to determine if they are the same. This process is performed by the logic 21 utilizing the appropriate characters fetched into the Look-Ahead Buffers 16. At the block 44, the Current Character is compared to the next n look-ahead characters that follow Current Character to determine if a run of the same character is about to commence. If the Current Character is the same as the next n look-ahead characters, the YES branch of the block 44 is taken to a run processing block 45. The details of the run processing block 45 are illustrated in FIG. 3.

Figure 5:
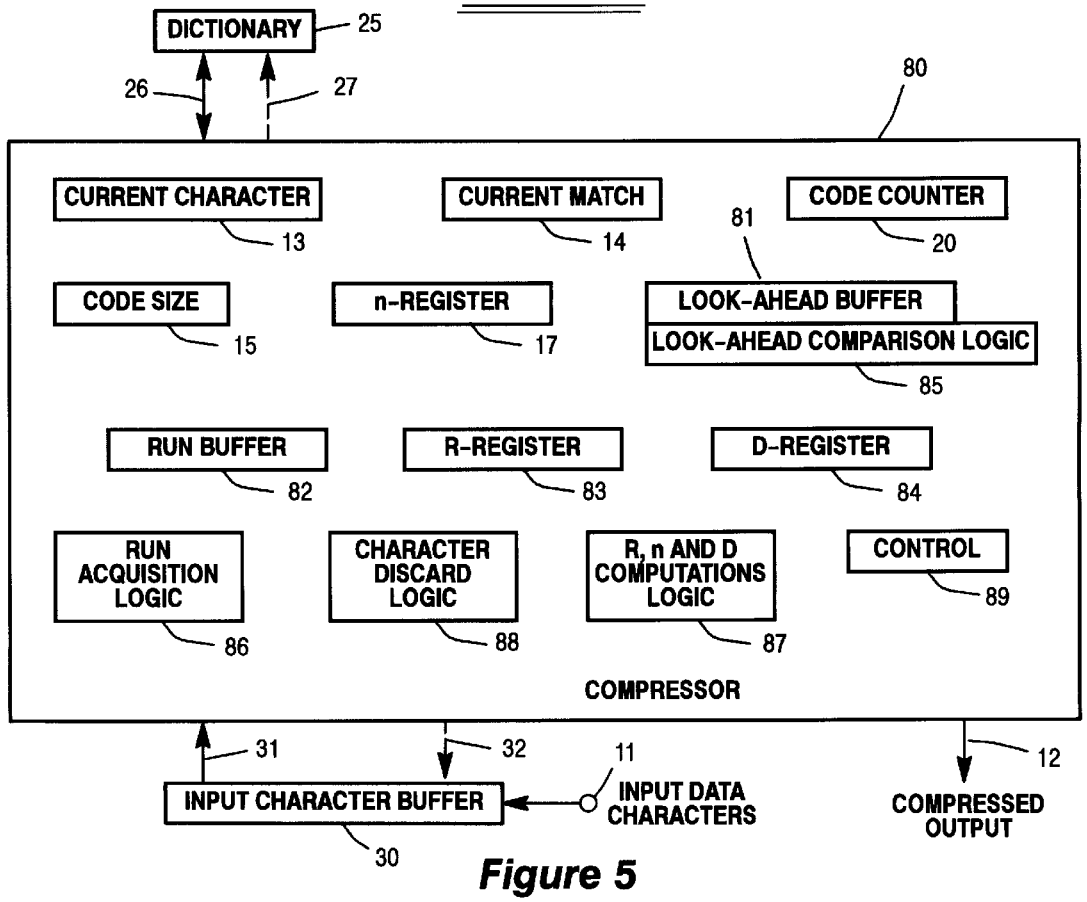
Figure 6:
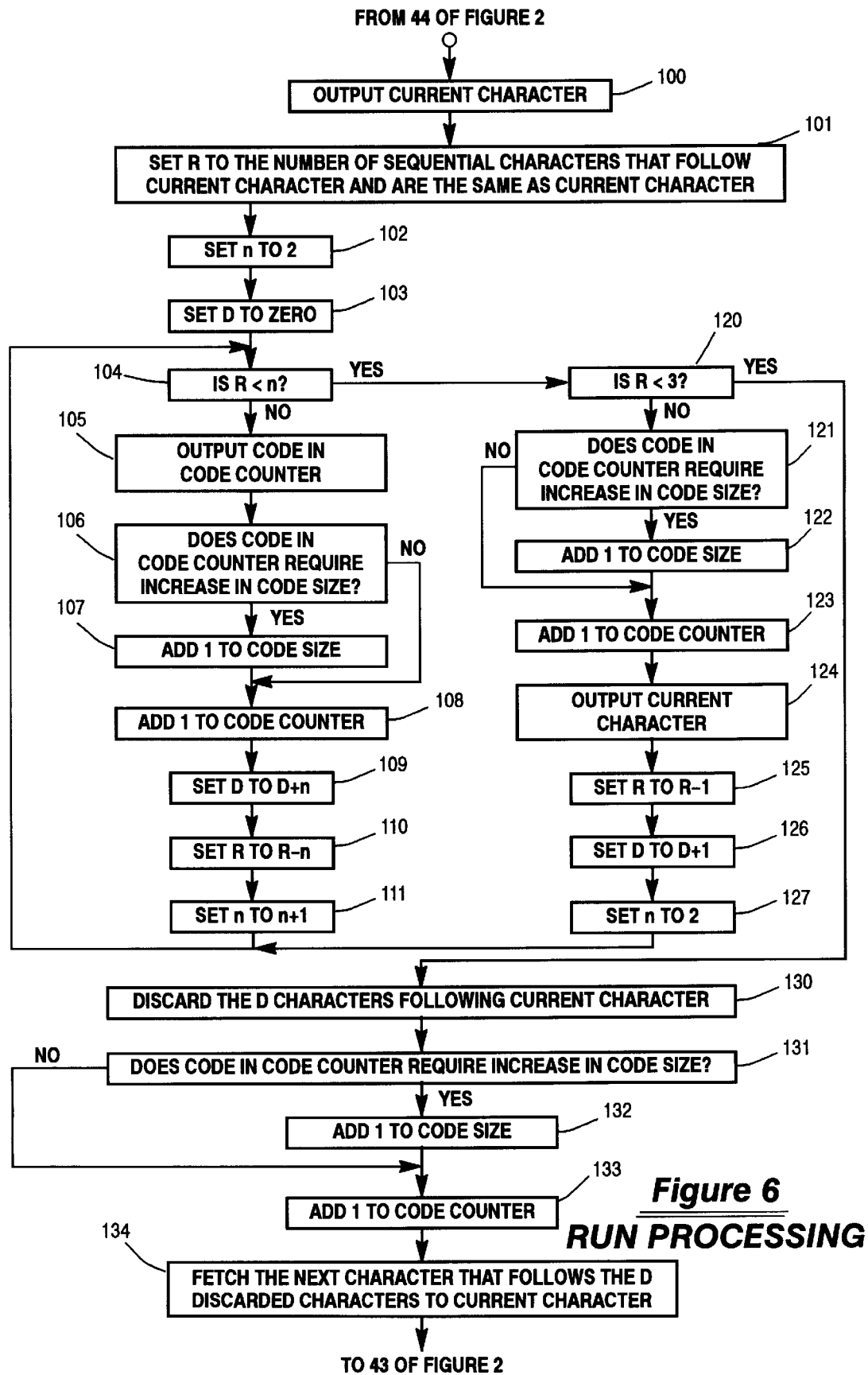
FIG. 6 is a control flow chart illustrating the run processing logic utilized in the flow chart of FIG. 2 so as to perform run processing in accordance with the iterative mathematical algorithm of the FIG. 5 embodiment of the present invention.
Figure 8:
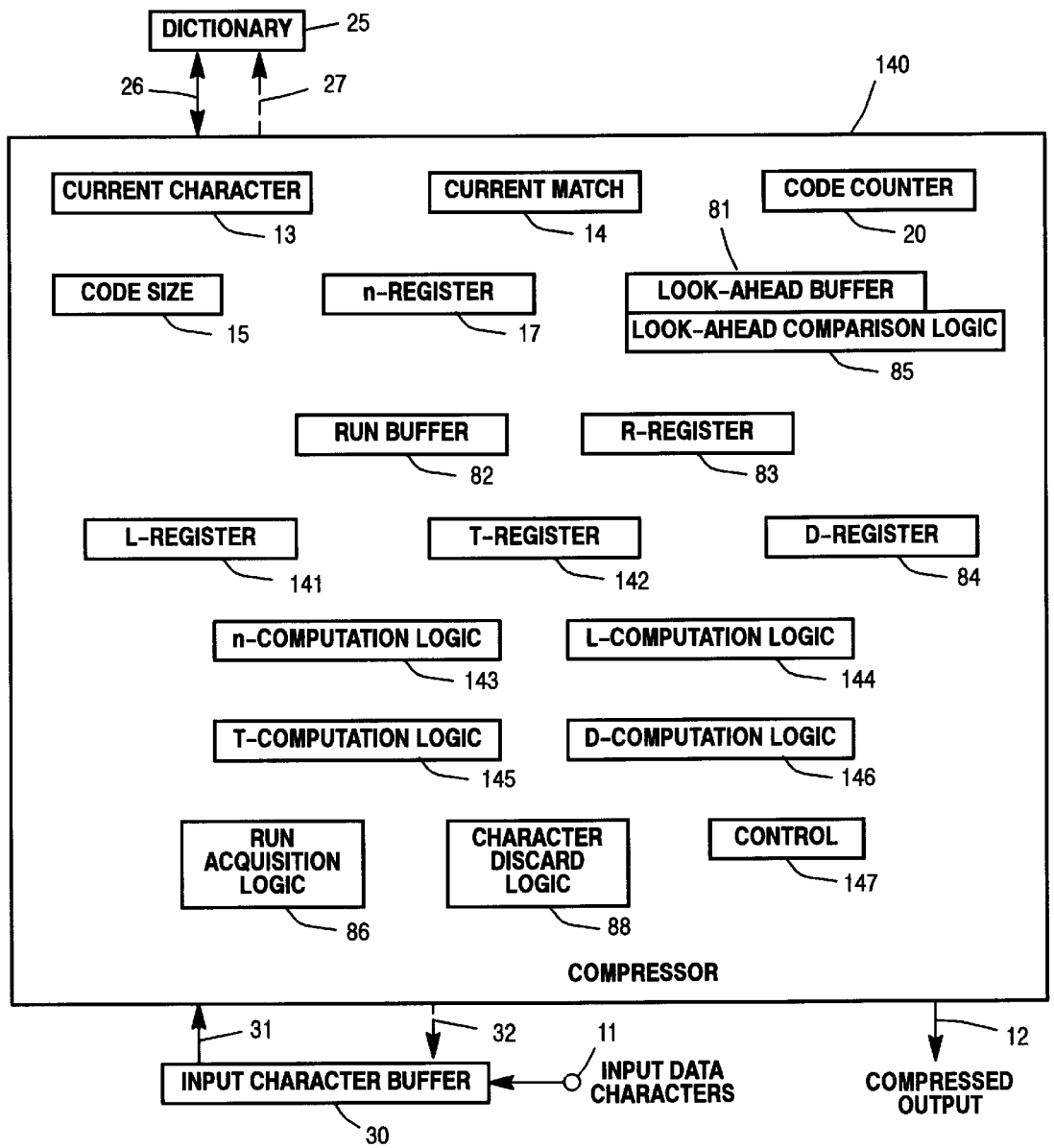
Figure 9:
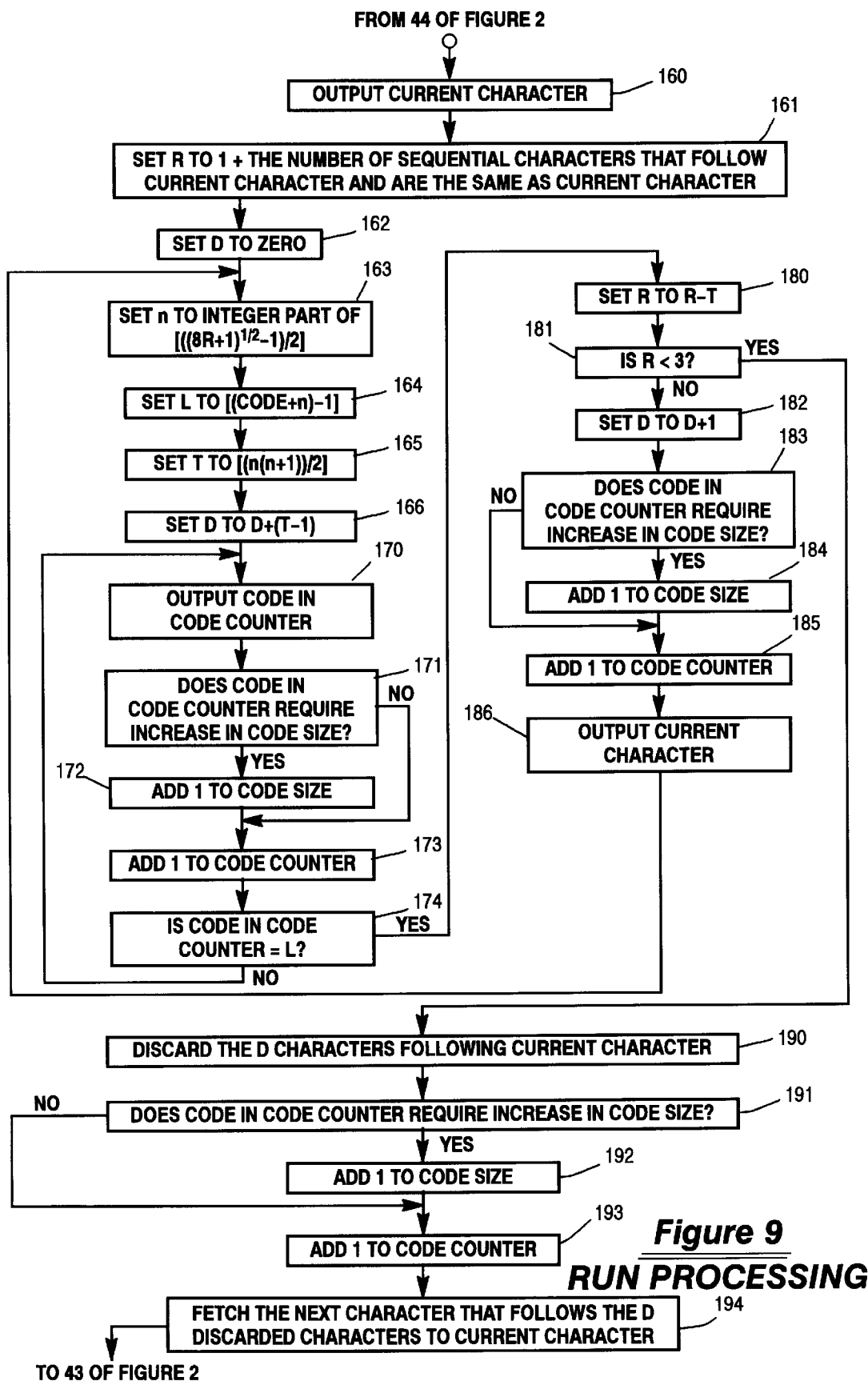
FIG. 9 is a control flow chart illustrating the run processing logic utilized in the flow chart of FIG. 2 so as to perform run processing in accordance with the quadratic equation mathematical algorithm of the FIG. 8 embodiment of the present invention.

As explained above, the flow chart of FIG. 2 also applies to the FIGS. 5 and 8 embodiments. For these embodiments the details of the run processing block 45 are illustrated in FIGS. 6 and 9, respectively.

If one of the n look-ahead characters does not match Current Character, the NO branch of the block 44 is taken to continue with conventional LZW data compression processing.

When the NO branch from the block 44 is taken, processing continues at a block 46 whereat the Current Match register 14 is set to the character in the Current Character register 13. Thereafter, at a block 47, the next input data character that follows the present Current Character is fetched to the Current Character register 13. The value in the Current Match register 14 together with the next character in the Current Character register 13 comprise a two-character string as is well appreciated in the art (e.g. see U.S. Pat. No. 4,558,302).

Processing continues at a block 50 whereat the Dictionary 25 is searched to determine if the string comprising the Current Match concatenated by the Current Character is in the Dictionary. Dictionary searching procedures are well known in the art for performing the function of the block 50 (e.g. see U.S. Pat. No. 4,558,302 and U.S. Pat. No. 5,861, 827).

If, at the block 50, the string is found in the Dictionary 25, the YES branch from the block 50 is taken to a block 51. At block 51, the contents of the Current Match register 14 is updated to contain an indication of the string that was found. As is well known in the art, a string has a code associated therewith and, generally, the string code of the currently matched string is set into the Current Match register 14. Details of specific implementations for the function of the block 51 are well known (e.g. see U.S. Pat. No. 4,558,302 and U.S. Pat. No. 5,861,827). After updating the Current Match register 14 with the currently matched string, control returns to the block 47 to fetch the next input data character to the Current Character register 13. In this manner, the loop formed by the blocks 47, 50 and 51 compares the input data character stream with the strings stored in the Dictionary 25 to find the longest match therewith.

At the block 50, when the concatenation of the currently matched string with the next character fetched at the block 47 results in an extended string that is not in the Dictionary 25, the NO branch from the block 50 is taken to a block 52. At the block 52, this extended string that was not found in the Dictionary 25 is entered therein and the extant code of the Code Counter 20 is assigned to this stored extended string. Details of specific implementations for the function of the block 52 are well known (e.g. see U.S. Pat. No. 4,558,302).

Processing continues at a block 53 whereat the code of the Current Match is output as part of the compressed code stream provided at the compressor output 12. The code of the Current Match is provided by the Current Match register 14. When Current Match is a multiple character string, the code of the string resides in the Current Match register 14 and was the longest match found in the Dictionary 25 as described above with respect to the block 50. It is appreciated that the Current Match that is output at the block 53 can also be a single character. The output code in this case is the value of the character. Implementation details of the functionality of block 53 are well known in the art (e.g. see U.S. Pat. No. 4,558,302 and U.S. Pat. No. 5,861,827).

Processing proceeds to a block 54 whereat the code in the Code Counter 20 is required. If so, processing continues to a block 55 whereat the Code Size register 15 is incremented by 1. If an increase in Code Size is not required at the block 54, the block 55 is by-passed to continue processing at a block 56. At block 56, the Code Counter 20 is incremented by 1.

Control then returns to the block 44 for run detection as previously described. If a run is not detected, a new LZW data compression cycle is initiated at blocks 46 and 47, as described above, with the Current Character set into the Current Match register 14 at the block 46 and the next Current Character fetched into the Current Character register 13 at the block 47. It is appreciated that, at the block 46, the Current Match register 14 is set to the input data character that resulted in a mismatch in the previous processing. Implementation details for the functionality of blocks 46 and 47 are well known in the art (e.g. see U.S. Pat. No. 4,558,302 and U.S. Pat. No. 5,861,827).

It is appreciated that aside from the blocks 43–45, the remainder of FIG. 2 depicts standard LZW data compression processing. Thus, any known implementation of LZW data compression can be utilized in implementing the LZW data compression aspects of the present invention.

In a manner to be described in detail with respect to the run processing block 45, the run processing terminates by fetching the next character to the Current Character register 13 that follows the run characters that were processed in the block 45. The output of the run processing block 45 returns to the block 43 to reset n to 2 and then proceed to run detection at the block 44. Thus, following the run processing of block 45, further run processing can occur depending on the test of the block 44. In other words, the return path illustrated from the block 45 to the block 43 provides preference to run processing over LZW processing.

It is appreciated that an alternative configuration can be effective by instead of returning the block 45 to the block 43, the return path can be made to the block 46. Returning the processing of the block 45 to the block 46 results in a search of the Dictionary 25 to determine if any LZW longest matches can be processed and output with concomitant updating of the Dictionary 25 prior to entering run processing. In other words, this connection provides preference to the LZW processing. In this alternative configuration, the block 56 returns to block 43 rather than block 44 to appropriately reset the n-register 17.

Figure 3:
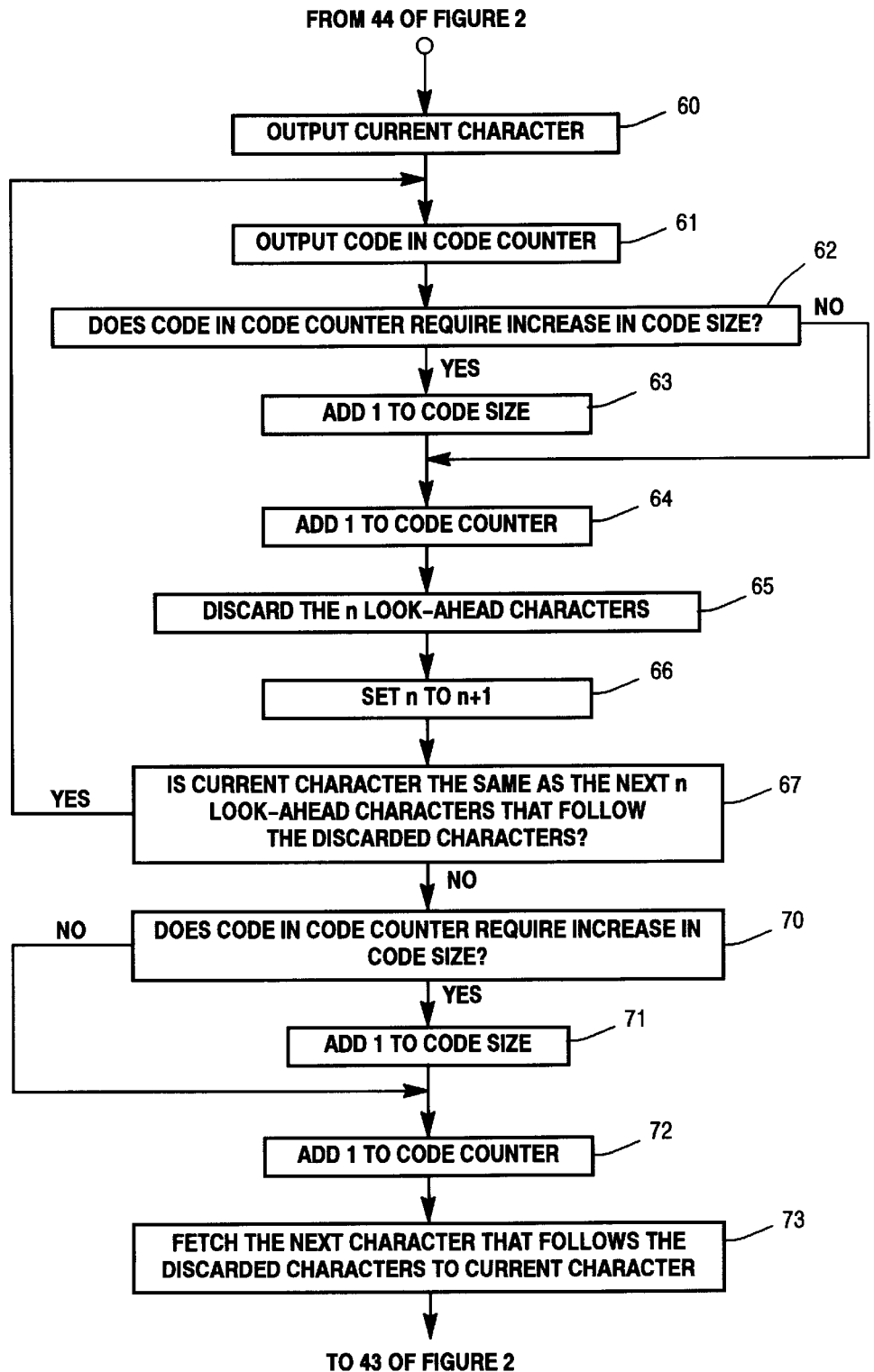
FIG. 3 is a control flow chart illustrating the run processing logic utilized in the flow chart of FIG. 2 so as to perform run processing in accordance with the iterative look-ahead algorithm of the FIG. 1 embodiment of the present invention.

Referring to FIG. 3, with continued reference to FIGS. 1 and 2, details of the run processing of the block 45 of FIG. 2 in accordance with the FIG. 1 embodiment are illustrated. It is appreciated that the run processing of FIG. 3 is substantially the same as the run processing described in detail in said Ser. No. 09/264,269.

Accordingly, at a block 60, the character in the Current Character register 13 is provided to the output 12 of the compressor 10. It is appreciated that even though this character has been output it still resides in the Current Character register 13. Processing continues at a block 61 whereat the code in the Code Counter 20 is provided at the output 12 of the compressor 10. At this point in the control flow, the first three characters of the potential run have been processed. The initial character of the run is in the Current Character register 13 and has been outputted at the block 60. Since "n" had been set to 2 at block 43 of FIG. 2, the block 44 of FIG. 2 compared the Current Character to the two look-ahead characters that followed Current Character. The code in the Code Counter 20 that is outputted at the block 61 represents the two look-ahead characters utilized in the block 44 of FIG. 2. These two characters are the first segment of the run following Current Character. At blocks 62 and 63, the Code Size logic discussed above with respect to blocks 54 and 55 of FIG. 2 is performed.

At a block 64, the Code Counter 20 is incremented by 1 to prepare the Cod Counter 20 for the processing of the next segment of the run if it should occur. At a block 65, the n look-ahead characters that have just been processed are discarded. The discarding occurs because the code representing these characters has been outputted at the block 61. The discarding of characters is performed by the logic 21 by clearing the Look-Ahead Buffers 16 of the appropriate characters.

Processing continues with a block 66 whereat the index n is advanced to n+1. This action is taken with respect to the n-register 17. Thus, at this point in the processing, n, which had previously been set to 2, is now advanced to 3 in preparation for determining if the next three look-ahead characters continue the run to the next numerically incremented run segment.

Accordingly, a decision block 67 is entered that tests the character in the Current Character register 13 against the next n look-ahead characters that follow the characters that were discarded at the block 65. This process is performed by the logic 21 utilizing the appropriate characters fetched into the Look-Ahead Buffers 16. If all n look-ahead characters match the Current Character, the YES branch is taken. If not, the NO branch is taken.

If the YES branch is taken from the block 67, the run of the character in the Current Character register 13 has continued to this next n character segment. Control then returns to the block 61 to continue the processing as described above. Briefly, the block 61 outputs the code that represents this n character run segment which is discarded at the block 65. The Code Counter 20 is again advanced at the block 64. The index n is advanced at the block 66 to investigate the character run further to determine if another contiguous and numerically incremented run segment exists in the input.

If, at the block 67, it is determined that insufficient input characters exist that are the same as the character in the Current Character register 13 so as to populate the next run segment, the NO branch is taken from the block 67. The Code Size test described above with respect to blocks 54 and 55 of FIG. 2 is then performed at blocks 70 and 71. At a block 72, the Code Counter 20 is incremented by 1. At a block 73, under control of the logic 21, the next character that follows the characters that were discarded at the block 65 is fetched to the Current Character register 13 to continue the processing. Accordingly, control then returns to the block 43 of FIG. 2.

It is appreciated that when the NO branch is taken from the block 67, the n look-ahead characters that are utilized to perform the test of block 67 are in the Look-Ahead Buffers 16. These characters are utilized to continue the processing with the first of such characters being utilized in the block 73 as the Current Character. Characters stored in the Look-Ahead Buffers 16 following the Current Character may then be employed in the block 44 of FIG. 2 as the look-ahead characters required therein. Logic 21 controls the Current Character register 13 and the Look-Ahead Buffers 16 so that these actions and the other actions of FIGS. 2 and 3 are appropriately performed by using, fetching and discarding the characters as required.

Referring to FIG. 4, with continued reference to FIGS. 1–3, an example of the operation of the compressor 10 in accordance with the flow charts of FIGS. 2 and 3 is illustrated. At the top of FIG. 4, an input data character stream is shown where sequential characters are identified by character sequence numbers. This is done to facilitate following the progress of the characters through the steps of the example. It is appreciated that the sequence numbers are shown for purposes of character identification and do not appear in the actual data character stream.

The example is largely self-explanatory, with the actions performed delineated in the left-hand column and the blocks of FIGS. 2 and 3 that participate in the actions designated in the right-hand column.

In actions 1–8, standard LZW data compression is performed on the input data characters through the character "a(5)". Several LZW compression cycles are performed and in each cycle, as noted in the right-hand column, the block 44 is traversed to test for a character run. With the block 44 positioned in the processing as illustrated in FIG. 2, run processing will occur prior to performing LZW processing where the Dictionary 25 is searched for longest matching character strings. Therefore, the run processing is taking precedence over the LZW processing. Utilizing the alternative configuration described above, where the run processing block 45 is returned to the block 46 rather than to the block 43, the LZW processing would take precedence over the run processing. With this alternative arrangement all strings that exist in the Dictionary 25 will be matched in the block 50 prior to invoking run processing at the block 44.

In action 9, block 44 of FIG. 2 recognized that the Current Character "a(5)" is the same as the next n look-ahead characters as observed in the input data character stream at the top of the figure. Control then proceeds to the block 45 for run processing. It is appreciated that even though the illustrated run of the character "a" begins with "a(4)", the character "a(4)" was absorbed into the LZW processing at action 7.

In action 9, the character "a(5)" is output pursuant to the block 60 of FIG. 3. The run is processed through the character "a(14)" at actions 10–12. The remainder of the run comprised of characters "a(15)" through "a(17)" is processed at actions 13 and 14 by the indicated blocks of FIGS. 2 and 3.

In a similar manner the run of the character "b" is processed at actions 15–18. At action 19 control returns to LZW processing.

More detailed descriptions of the actions of FIG. 4 relative to the blocks of FIGS. 2 and 3 are readily apparent and will not be provided for brevity.

Referring to FIG. 5, with continued reference to FIGS. 1 and 2, a schematic block diagram of an alternative preferred embodiment of the present invention is illustrated. FIG. 5 illustrates a data compressor 80 having a number of components that are the same as those described above with respect to FIG. 1 and which are given the same reference numerals as in FIG. 1. The descriptions thereof provided above with respect to FIG. 1 are applicable to FIG. 5. The compressor 80 also includes working registers denoted as a Look-Ahead Buffer 81, a Run Buffer 82, an R-register 83 and a D-register 84.

The compressor 80 further includes look-ahead comparison logic 85 that performs comparisons between a character in the Current Character register 13 and characters in the Look-Ahead Buffer 81 to determine if a run is about to commence as described above with respect to FIGS. 1 and 2. The compressor 80 further includes run acquisition logic 86 for acquiring and counting the characters of a run that follow Current Character pursuant to the run being detected by the logic 85. The number of run characters counted by the logic 86 is stored in the R-register 83. The Run Buffer 82 provides any buffering required in performing these functions.

The compressor 80 also includes R, n and D computations logic 87 utilized in processing an acquired run in a manner to be explained. The compressor 80 furthermore includes character discard logic 88 for discarding the processed characters of a run. Further included in the compressor 80 is control 89 for controlling the operations of the compressor 80 in accordance with the operational flow charts of FIGS. 2 and 6 in a manner to be described.

With respect to the Input Character Buffer 30, the individual input data characters are applied from the Input Character Buffer 30 via the bus 31 to the Current Character register 13, the Look-Ahead Buffer 81 and the run acquisition logic 86 in accordance with operations to be described.

Briefly, the operation of the compressor 80 is the same as that of the compressor 10 described above with respect to performing LZW data compression and diverting to run processing when a character run is detected. The run processing utilized in the FIG. 5 embodiment is based on that described in said patent application Ser. No. 09/300,810 with respect to the FIGS. 1–3 embodiment thereof. Specifically, if a character run is detected, the character beginning the run, residing in the Current Character register 13 is output and the number of run characters following Current Character that are the same as Current Character is set into the R-register 83. Run processing logic is then invoked to mathematically determine the numerically increasing run segments that exist in the run. Specifically, it is determined if contiguous run segments of 2 characters, 3 characters, 4 characters, 5 characters, etc., exist in the run following the character in the Current Character register 13. For each such detected run segment, the code in the Code Counter 20 is output and the Code Counter 20 is incremented by 1. This process is implemented by iteratively subtracting the number of characters in each contiguous segment from the number of run characters until insufficient characters remain to populate the next run segment in the sequence.

When this occurs and three or more characters remain to be processed, the character residing in the Current Character register 13 is output and the Code Counter 20 is again advanced by 1. The iterative process is reset to a run segment of two characters and the process continued until less than three run characters remain.

The registers 13, 15, 17, 83 and 84, the buffers 81 and 82, the Code Counter 20 and the logic 85–88 are utilized in performing the character run processing as explained with respect to FIGS. 2 and 6. The control flow charts of FIGS. 2 and 6 illustrate the detailed operations to be executed by the compressor 80 so as to perform data compression in accordance with the invention. The control 89 is considered as containing appropriate circuitry such as state machines to control execution of the operations.

As explained above with respect to FIG. 1, the control flow chart of FIG. 2 also applies to the FIG. 5 embodiment with the run processing block 45 implemented by the control flow chart of FIG. 6. The descriptions of FIG. 2 given above with respect to the FIG. 1 embodiment also apply to the FIG. 5 embodiment.

Referring to FIG. 6, with continued reference to FIGS. 2 and 5, a control flow chart providing the details of the run processing logic 45 of FIG. 2 as utilized in the FIG. 5 embodiment is illustrated. As discussed above and in said Ser. No. 09/300,810, the run is considered comprised of the first character thereof held in the Current Character register 13 followed by contiguous numerically increasing segments of the same character. Accordingly at a block 100, the character in the Current Character register 13 is provided to the output 12. It is appreciated that even though this character has been output it still resides in the Current Character register 13. At a block 101, the number of sequential characters R that follow Current Character and are the same as the character in the Current Character register 13 is set into the R-register 83. At a block 102, the index n in the n-register 17 is set to two. Thereafter, at a block 103, the number D of run characters to be discarded is initialized to zero.

In the logic to be described, the index n is iteratively incremented by 1 and iteratively subtracted from R until R (the number of characters remaining in the run to be processed) is less than n (the number of characters required in the next following contiguous run segment). For each such run segment mathematically found to exist in the run, the code in the Code Counter 20 is output and the Code Counter 20 is incremented by 1. Additionally, the quantity D in the D-register 84 is incremented by n as each segment is processed so that the appropriate number of run characters are discarded at the termination of the run processing.

Accordingly, processing continues at a block 104 whereat it is determined if R is less than n. If not, control proceeds to a block 105 whereat the code in Code Counter 20 is output. At blocks 106 and 107, the Code Size logic discussed above with respect to blocks 54 and 55 is performed. At a block 108, the Code Counter 20 is incremented by 1 to prepare the Code Counter 20 for the processing of the next segment of the run if R should remain sufficiently large to populate the segment.

At blocks 109–111, D is set to D+n, R is set to R−n, and the index n is set n+1, respectively. These actions are performed with respect to the registers 84, 83 and 17, respectively. Control then returns to block 104 to test the diminished value of R against the incremented value of n. It is appreciated that the computations and comparisons performed with respect to R, n and D at the blocks 102–104 and 109–111 are performed by the logic 87 of FIG. 5.

When R has been diminished and n has been incremented to the point where R is less than n, the YES branch from the block 104 is taken to a block 120. Block 120 determines if R is less than three. If R is greater than or equal to three, sufficient characters remain in the run to reset the loop represented by blocks 104–111 to process these remaining R characters of the run.

Accordingly, when R is greater than or equal to three, the NO branch from the block 120 is taken to blocks 121 and 122 whereat the Code Size logic discussed above with respect to blocks 54 and 55 is performed. At a block 123, the Code Counter 20 is incremented by 1 to maintain synchronism with the compressed code output.

In preparation for processing the remaining R characters of the run, the character in the Current Character register 13 is output at a block 124. Accordingly, at a block 125, the value of R in the R-register 83 is set to R−1 and, at a block 126, the value of D in the D-register 84 is set to D+1. At a block 127, the index n in the n-register 17 is reset to two and control returns to the block 104.

After one or more iterations of the loop comprised of blocks 104–111, R will diminish to a value less than three. When control enters block 120 with R less than three, the YES branch of block 120 is taken to a block 130.

It is appreciated that at this point in the processing only 2, 1 or 0 characters remain in the run that were not processed by the above described logic of FIG. 6. At the block 130, the D characters of the run following Current Character are discarded. The character discard logic 88 is utilized to this effect. If these characters are held in the Run Buffer 82, the logic 88 discards the appropriate characters utilizing the value in the D-register 84. Thereafter, the Code Size test described above with respect to blocks 54 and 55 is performed at blocks 131 and 132. At a block 133, the Code Counter 20 is incremented by 1. At a block 134, under control of the logic 88, the next character that follows the characters that were discarded at the block 130 is fetched to the Current Character register 13 to continue the processing. Accordingly, control then returns to the block 43 of FIG. 2.

An alternative configuration of the embodiment of FIGS. 2, 5 and 6 may be effected by eliminating the blocks 120–127 of FIG. 6 and returning the YES branch of the block 104 directly to the block 130. If three or more run characters remain to be processed, control will re-enter block 100 of FIG. 6 after traversing blocks 43 and 44 of FIG. 2.

Referring to FIG. 7, with continued reference to FIGS. 2, 5 and 6, an example of the operation of the compressor 80 in accordance with the flow charts of FIGS. 2 and 6 is illustrated. The format of FIG. 7 is similar to that of FIG. 4 and descriptions given above with respect to FIG. 4 are applicable. The same data character stream illustrated in FIG. 4 is utilized in FIG. 7.

Actions 1–8 of FIG. 7 are identical to actions 1–8 of FIG. 4 and the descriptions given above with respect to FIG. 4 are applicable.

In actions 9–12, run characters "a(5)" through "a(14)" are processed utilizing the loop comprised of blocks 104–111 of FIG. 6. In actions 13 and 14, the remainder of the run is processed utilizing blocks 120–127 of FIG. 3 with the characters "a(6)" through "a(17)" discarded in action 14.

In a similar manner, the run of the character "b" is processed in actions 15–18.

In action 19, control returns to LZW processing.

More detailed descriptions of the actions of FIG. 7 relative to the blocks of FIGS. 2 and 6 are readily apparent and will not be provided for brevity.

Referring to FIG. 8, with continued reference to FIGS. 1, 2 and 5, a schematic block diagram of an alternative preferred embodiment of the present invention is illustrated. FIG. 8 illustrates a data compressor 140 having a number of components that are similar to those described above with respect to FIGS. 1 and 5 and which are given the same reference numerals as in FIGS. 1 and 5. The descriptions thereof provided above with respect to FIGS. 1 and 5 are generally applicable to FIG. 8.

The compressor 140 also includes working registers denoted as an L-register 141 and a T-register 142 for holding variables used in the operation of the compressor 140 in a manner to be described with respect to FIG. 9. The compressor 140 further includes n-computation logic 143, L-computation logic 144, T-computation logic 145 and D-computation logic 146 for processing runs in a manner to be described with respect to FIG. 9. The compressor 140 also includes control 147 for controlling the operations of the compressor 140 in accordance with the operational flow charts of FIGS. 2 and 9 in a manner to be described.

Briefly, the operation of the compressor 140 is generally the same as the operation described above with respect to the compressors 10 and 80 except in the manner in which run processing is performed. As described above, the operational flow chart of FIG. 2 also applies to the compressor 140 with the run processing logic 45 implemented by the operational flow chart of FIG. 9. A run is processed by applying an equation to the number of characters in the run to determine the number of segments that exist in the run. A further equation is utilized to determine a count for the Code Counter 20 to attain so as to provide codes to represent these segments. A further equation, of the quadratic type, is applied to determine the number of characters that will be processed thereby providing a basis for the number of characters to be discarded. The Code Counter 20 is sequentially incremented and the codes therein output until the Code Counter 20 attains the count determined by the equations.

After performing this process, the computed number of characters processed is subtracted from the number of characters of the run and if three or more characters remain to be processed, the character residing in the Current Character register 13 is output and the Code Counter 20 is again advanced by 1. The computational process is reset by applying the number of the remaining characters in the run to the equations until less than three run characters remain.

The registers 13, 15, 17, 84, 141 and 142; the buffers 81 and 82; the Code Counter 20 and the logic 85, 86, 88 and 143–146 are utilized in performing the character run processing as explained below with respect to FIGS. 2 and 9. The control flow charts of FIGS. 2 and 9 illustrate the detailed operations to be executed by the compressor 140 so as to perform data compression in accordance with the invention. The descriptions given above with respect to FIG. 2 also apply to the compressor 140 except that the run processing logic 45 is performed by the operational flow chart of FIG. 9. The control 147 is considered as containing appropriate circuitry such as state machines to control execution of the operations.

Referring to FIG. 9, with continued reference to FIGS. 2 and 8, a control flow chart illustrating the details of the run processing logic 45 utilized in the FIG. 8 embodiment is illustrated. Before describing the details of FIG. 9, it should be appreciated that the illustrated computations are based on the equation for the sum of the first n numbers as follows:

$$S(n)=1+2+3+4+\ldots+n=[(n(n+1))/2].$$

As discussed above, a run can be considered as comprised of contiguous numerically increasing run segments where the first segment of a single character is held in the Current Character register 13. Following Current Character are contiguous run segments of 2 characters, 3 characters, 4 characters, . . . , n characters. It is appreciated that further characters can exist in the run, but the number of further characters will be less than n+1. It is therefore appreciated that R, the number of characters in the run, will be equal to S(n) plus the number of further characters. It is furthermore appreciated that the above given quadratic equation in n can be solved for n in terms of S utilizing the quadratic equation solution for obtaining the roots thereof. One root of the equation is:

$$n=[((8S+1)^{1/2}-1)/2].$$

It is observed that when this equation for n is applied to the number of characters in a run, the integer part of the right-hand side of the equation yields the largest run segment in the contiguous sequence of segments that exist in the run. In a manner to be described, this number is used to obtain the sequence of codes from the Code Counter to represent the respective contiguous segments of the run. This number is also used in processing the remaining characters of the run in a manner to be described. The run processing of FIG. 9 is based on the run processing described in detail in said Ser. No. 09/300,810 with respect to the FIGS. 2, 6 and 7 embodiment thereof.

With continued reference to FIG. 9, at a block 160, the character in the Current Character register 13 is provided to the output 12. It is appreciated that even though this character has been output it still resides in the Current Character register 13.

Processing proceeds to a block 161 whereat the R-register 83 is set to one plus the number of sequential characters that follow Current Character and are the same as Current Character. The run acquisition logic 86 is utilized to perform this function. Any buffering that is required in the run acquisition process is provided by the Run Buffer 82. It is appreciated that the characters of the run are acquired by the run acquisition logic 86 from the Input Character Buffer 30 via the bus 31 under control of the compressor 140 utilizing the control bus 32. Thus, at the block 161, the number of characters in the run that is detected at the block 44 of FIG. 2 is entered into the R-register 83. The Current Character register 13 holds the value of the run character.

Control continues at a block 162 whereat the D-register 84 is initialized to zero. In the processing of FIG. 9, the D-register 84 will accumulate the number of run characters to be discarded after they have been processed.

Processing proceeds to a block 163 where, using the logic 143 of FIG. 8, R is utilized in the above equation for n to provide:

$$n=\text{Integer Part of }[((8R+1)^{1/2}-1)/2].$$

Thus, the block 163 generates the variable n that provides the number of characters in the largest segment of characters that exists in the contiguous segment sequence of the run and also provides an indication of the number of such segments comprising the run. The value of n resides in the n-register 17.

At a block 164, n is utilized to derive the variable L representing the code in the Code Counter 20 that is next available after codes have been assigned from the Code Counter 20 to the contiguous respective segments of the run in a manner to be described. The logic 144 of FIG. 8 is utilized to derive L as follows:

$$L=[(\text{code}+n)-1]$$

where code is the code existing in the Code Counter 20 when control enters block 164. The value of L resides in the L-register 141.

Processing proceeds to a block 165 where a variable T is derived utilizing the logic 145 of FIG. 8. The variable T represents the number of characters in the run that are currently being processed as derived from the variable n as obtained from the block 163. The variable T therefore represents the sum of the characters of the run in the contiguous run segments comprising 1 character, 2 characters, 3 characters, 4 characters, . . . , n characters. The logic 145 provides T as follows:

$$T=[(n(n+1))/2].$$

The variable T will be utilized, in a manner to be described, to process further characters in the run and to generate the variable D representing the number of processed run characters to be discarded. The variable T resides in the T-register 142 of FIG. 8.

Processing proceeds to a block 166 whereat the variable D is derived utilizing the logic 146 of FIG. 8. The logic 146 provides D as follows:

$$D=D+(T-1).$$

The variable T is diminished by 1 to account for the outputting of the Current Character at the block 160. The variable D resides in the D-register 84 of FIG. 8 and is utilized to accumulate the processed characters to be discarded as iterations of the logic of FIG. 9 are performed.

Processing proceeds to a block 170 whereat the code in Code Counter 20 is output. This code represents one of the segments in the run that is being processed. Thereafter, the Code Size test described above with respect to blocks 54 and 55 of FIG. 2 is performed at blocks 171 and 172. At a block 173, the Code Counter 20 is incremented by 1.

At a block 174, the code in the Code Counter 20 is compared to L to determine if all of the codes have been assigned to the respective segments of the run. If the code in the Code Counter 20 is not equal to L, the NO branch returns to the block 170 to continue the process.

It is appreciated that the loop comprised of the blocks 170–174 outputs a sequence of codes representative, respectively, of the sequence of segments mathematically determined in the blocks 163–166 to exist in the detected run. When the code in the Code Counter 20 attains the value L, the YES branch from the block 174 is taken to a block 180.

At the block 180, the variable R in the R-register 83 is set to R-T. Thus, the variable R has been reset so as to mathematically process remaining characters in the run.

Accordingly, at a block 181, R is compared to 3. If R is greater than or equal to 3, further processing of the detected run may be performed utilizing the blocks 163–166 and 170–174. Thus, if R is greater than or equal to 3, the NO branch from the block 181 is taken to a block 182 wherein the variable D in the D-register 84 is incremented by 1. Control proceeds to blocks 183 and 184 whereat the Code Size logic discussed above with respect to blocks 54 and 55 is performed. At a block 185, the Code Counter 20 is incremented by 1 and, at a block 186, the character in the Current Character register 13 is output. It is appreciated that the variable D is incremented by 1 at block 182 to account for the Current Character output at the block 186.

Control then returns to block 163 wherein the value of R derived at the block 180 is utilized as described above with respect to the blocks 163–166 and 170–174 to generate further codes corresponding to segments in the run. It is appreciated, however, that when control returns to the blocks 163–166 and 170–174 from the block 186, the mathematical process of these blocks is applied to a run of length R-T.

When the variable R has been diminished at block 180 to a value less than 3, the YES branch from block 181 is taken to a block 190. Blocks 190–194 perform the same functions described above with respect to blocks 130–134 of FIG. 6 and the descriptions given above with respect thereto are applicable to the blocks 190–194 of FIG. 9. Briefly, the D characters following Current Character are discarded, the Code Size logic discussed above is performed, the Code Counter 20 is incremented by 1 and the next character that follows the discarded characters is fetched to the Current Character register 13.

In a manner similar to that described above with respect to FIG. 6, a further embodiment may be effected by eliminating the blocks 180–186 and connecting the YES branch from the block 174 directly to the block 190.

Referring to FIG. 10, with continued reference to FIGS. 2, 8 and 9, an example of the operation of the compressor 140 in accordance with the flow charts of FIGS. 2 and 9 is illustrated. The format of FIG. 10 is similar to that of FIGS. 4 and 7 and descriptions given above with respect to FIGS. 4 and 7 are applicable. The same data character stream illustrated in FIGS. 4 and 7 is utilized in FIG. 10. Actions 1–8 and 19–22 illustrate the LZW processing described above with respect to the similarly numbered actions of FIGS. 4 and 7. The run processing of actions 9–18 is similar to the run processing of the similarly numbered actions of FIGS. 4 and 7 except that the quadratic equation processing of FIG. 9 is utilized in FIG. 10 rather than the run processing of FIGS. 3 and 6 as utilized in FIGS. 4 and 7, respectively.

More detailed descriptions of the actions of FIG. 10 relative to the blocks of FIGS. 2 and 9 are readily apparent and will not be provided for brevity.

With further reference to FIGS. 4, 7 and 10 it is noted that the same input data character stream results in the same output compressed code stream for the three different algorithms exemplified. It is noted that for the run processing of actions 9–18 no dictionary accesses are effected.

All of the above described embodiments are predicated on a variable length output. It is appreciated that embodiments could also be predicated on a fixed length code output of, for example, 12 bits, as is well known. In such embodiments, the Code Size register 15 as well as Code Size test blocks 54 and 55 of FIG. 2 and the corresponding blocks of FIGS. 3, 6 and 9 would not be utilized.

It is appreciated that in the above described embodiments, the value of n set into the n-register 17 at the block 43 of FIG. 2 determines the run detection sensitivity of the system. The variable n should be set equal to at least 2. The lower the number to which n is set the more sensitive the system will be to detecting the existence of a character run.

It is noted, however, in the embodiment of FIGS. 1–3 that n should be set to 2 at the block 43. This is because the operations of the flow chart of FIG. 3 are predicated on outputting the code at block 61 corresponding to the two character run segment following Current Character. In the embodiment of FIGS. 2, 5 and 6, and the embodiment of FIGS. 2, 8 and 9, n can be set to 2 or more at the block 43 of FIG. 2. This is because in FIG. 6, block 102, n is reset to 2 to assure correct processing in the subsequent FIG. 6 logic. Also in FIG. 9, n is set to the appropriate value at the block 163.

It is appreciated from the above that the Look-Ahead Buffers 16 and logic 21 of FIG. 1 operate somewhat differently from the Look-Ahead Buffer 81 and logic 85 of FIGS. 5 and 8. In the FIG. 1 embodiment, the look-ahead function is utilized both in the run detection function of block 44 of FIG. 2 and in the run processing logic of FIG. 3, block 67. In the FIG. 5 and FIG. 8 embodiments, the look-ahead function is only utilized in the run detection of block 44 of FIG. 2.

With respect to the FIG. 5 and FIG. 8 embodiments, although the Run Buffer 82, R-register 83 and run acquisition logic 86 are given the same reference numerals, minor functional differences exist as discussed above with respect to FIGS. 6 and 9. When a run has been detected and the logic of FIG. 6 is utilized, R is set to the number of the sequential run characters that follow Current Character and are the same as Current Character. This is seen at FIG. 6, block 101. When, however, the logic of FIG. 9 is utilized, R is set to the number of characters in the run, including Current Character, as seen in FIG. 9, block 161. It is readily apparent that minor differences exist between these components of FIGS. 5 and 8 to accommodate this operational distinction.

It is appreciated that a compatible decompressor can readily be provided that receives the compressed output of the compressor 10, 80 or 140 operating in synchronism therewith to recover the input data characters corresponding thereto. If the sequence of output codes, as delineated in the "OUTPUT" columns of FIGS. 4, 7 and 10 are processed by the decompressor, the input data character streams illustrated in the drawings will be recovered.

It is understood that the protocols of the decompressor should be compatible with those of the compressor. In the examples of FIGS. 4, 7 and 10, an ASCII alphabet supported by 8 bits is assumed. The ASCII alphabet is comprised of 256 characters. The Code Counter 20 is initialized at block 40 of FIG. 2 to a code of 258. The code 257 may, for example, be utilized as a control code as is well understood in the art. The decompressor should have the same alphabet size and initial conditions, such as initial Code Counter value and initial Code Size, as the compressor. Furthermore, as is well appreciated in the art, the Code Size of the compressor embodiments of the present invention and the Code Size of the decompressor should be advanced in synchronism with respect to each other.

As is well known, the compressor and decompressor can either be initialized with all the single character strings or single characters can be distinguished from compressed codes by the respective values thereof. An ASCII character has a value that is equal to or less than 256, whereas in the ASCII examples of FIGS. 4, 7 and 10, compressed codes have a value equal to or greater than 258. It is furthermore well known that other single character code protocols may also be utilized. The single character code protocol that is used in the compressor embodiments of the present invention should also be utilized in the decompressor.

It is appreciated that the Code Counter 20 is incremented as described above so as to maintain synchronism between the run and non-run processing. This is particularly seen at blocks 64, 72, 108, 123, 133, 173, 185 and 193 of the above described figures.

The above embodiments compress a stream of input data characters. The input data characters can be over any size alphabet having any corresponding character bit size. For example, the data characters can be textual, such as ASCII characters, over an alphabet, such as the 256 character ASCII alphabet of eight-bit characters. The input data can also be binary characters over the two character binary alphabet 1 and 0 having a one-bit sized character. It is appreciated that textual data can also be compressed over the two character alphabet of the underlying binary data.

It is appreciated that the above-described embodiments of the invention may be implemented in hardware, firmware, software or a combination thereof. Discrete circuit components may readily be implemented for performing the various described functions. In a software embodiment, appropriate modules, programmed with coding readily generated from the above-described flow charts, may be utilized.

The run processing algorithms of FIGS. 3, 6 and 9 are described above in terms of use in an LZW data compression system. It is appreciated that these algorithms are essentially system independent and may be used alone or in combination with a variety of systems.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. A data compression method for compressing an input stream of data characters into an output stream of compressed codes, said method including an LZW data compression process, said LZW data compression process including storing strings of data characters, assigning respectie codes to said stored strings from a code counter and incrementing said code counter for each said stored string, said method comprising:

detecting when a run of data characters is occurring in said input stream by detecting when a predetermined number of adjacent data characters of said input stream are the same with respect to each other, said detected run including contiguous numerically increasing segments, a segment having one data character less than the next following adjacent segment of said detected run, determining consecutive codes from said code counter to correspond, respectively, to said contiguous segments of said detected run, using said LZW data compression process to compress said input stream when a run is not detected occurring therein by comparing said input stream to said stored strings to determine longest matches therewith and providing said codes assigned thereto, thereby providing LZW compressed codes, and outputting the data character of said detected run and said consecutive codes corresponding to said contiguous segments and outputting said LZW compressed codes so as to provide said output stream.

2. The method of claim 1 wherein said determining step comprises looking ahead in said input stream when said run is detected to detect said contiguous numerically increasing segments that exist in said run, and assigning said consecutive codes from said code counter to said detected contiguous segments, respectively.

3. The method of claim 2 wherein said detected run includes a last segment having one data character more than the prior adjacent segment of said detected run, further including detecting that said input stream following said last segment contains an insufficient number of adjacent data characters that are the same as the data character of said detected run to populate a next following adjacent segment, and incrementing said code counter to a next following code after said insufficient number of data characters has been detected.

4. The method of claim 3 further including discarding the data characters of each said segment of said detected run for which an assigned code is outputted.

5. The method of claim 4 further including continuing said method with the next data character of said input stream following the discarded characters of said last segment.

6. The method of claim 1 wherein said predetermined number of said adjacent data characters comprises three data characters.

7. The method of claim 1 wherein said determining step comprises determining a number representative of the number of data characters in said detected run, and mathematically determining, by a mathematical algorithm using said representative number, said consecutive codes from said code counter that correspond, respectively, to said contiguous segments of said detected run.

8. The method of claim 7 wherein said detected run includes further data characters following said contiguous segments, said further data characters forming a run including further contiguous numerically increasing segments, said method further including outputting the data character of said detected run, incrementing said code counter to a next following code, recursively utilizing said mathematical algorithm, using said number of further data characters, to mathematically determine further consecutive codes from said code counter corresponding, respectively, to said further contiguous segments, and outputting said further consecutive codes.

9. The method of claim 7 wherein said steps of mathematically determining and outputting include initializing an index denoting the number of data characters in a segment, outputting the code in said code counter and incrementing said code counter to a next following code, diminishing said representative number by subtracting said index therefrom, incrementing said index by one, comparing said diminished representative number to said incremented index, and repeating the above given steps from outputting said code in said code counter through comparing said diminished representative number to said incremented index until said diminished representative number is less than said incremented index.

10. The method of claim 9 further including the following steps when said diminished representative number is less than said incremented index but not less than three incrementing said code counter to a next following code, outputting said data character of said detected run, re-initializing said index, and repeating said steps of outputting said code in said code counter through comparing said diminished representative number to said incremented index until said diminished representative number is less than said incremented index.

11. The method of claim 10 further including the step of decrementing said diminished representative number by one.

12. The method of claim 7 further including discarding the data characters of said segments of said detected run for which corresponding codes are outputted, incrementing said code counter to a next following code, and continuing said method with the next data character of said input stream following said discarded data characters.

13. The method of claim 7 wherein said steps of mathematically determining and outputting include initializing an index denoting the number of data characters in a segment, initializing a discard number, outputting the code in said code counter and incrementing said code counter to a next following code, increasing said discard number by adding said index thereto, diminishing said representative number by subtracting said index therefrom, incrementing said index by one, comparing said diminished representative number to said incremented index, and repeating the above given steps from outputting said code in said code counter through comparing said diminished representative number to said incremented index until said diminished representative number is less than said incremented index, said method further including discarding data characters of said detected run in accordance with said discard number, incrementing said code counter to a next following code, and continuing said method with the next data character of said input stream following said discarded data characters.

14. The method of claim 13 further including the following steps when said diminished representative number is less than said incremented index but not less than three incrementing said code counter to a next following code, outputting said data character of said detected run, re-initializing said index, and repeating said steps of outputting said code in said code counter through comparing said diminished representative number to said incremented index until said diminished representative number is less than said incremented index.

15. The method of claim 14 further including the step of decrementing said diminished representative number by one.

16. The method of claim 15 further including the step of incrementing said discard number by one.

17. The method of claim 15 wherein said predetermined number of said adjacent data characters comprises three data characters.

18. The method of claim 7 wherein said steps of mathematically determining and outputting include performing a first computation, using a first equation, computing the number of said contiguous numerically increasing segments included in said detected run in terms of said representative number, performing a second computation computing a limit using a second equation that includes adding said number of said contiguous segments to the code in said code counter, and outputting said code in said code counter and incrementing said code counter to a next following code until said next following code is equal to said limit.

19. The method of claim 18 further including performing a third computation, using a third equation, computing a discard number in terms of the number computed in said first computation.

20. The method of claim 19 further including the following steps when said next following code is equal to said limit diminishing said representative number by said discard number and performing the following steps when said diminished representative number is not less than three, outputting the data character of said detected run, incrementing said code counter to a next following code, using said diminished representative number in said first equation to re-compute said first computation, re-computing said limit using said second equation applied to the result of said re-computed first computation, and outputting the code in said code counter and incrementing said code counter to a next following code until said next following code is equal to said re-computed limit.

21. The method of claim 20 further including the step of re-computing said discard number using said third equation applied to the result of said re-computed first computation.

22. The method of claim 21 wherein said steps of mathematically determining and outputting further include initializing an accumulated discard number, and increasing said accumulated discard number by said discard number and said re-computed discard number.

23. The method of claim 22 wherein, when said next following code is equal to said limit and said diminished representative number is not less than three, said steps of mathematically determining and outputting further include incrementing said accumulated discard number by one.

24. The method of claim 23 further including discarding data characters of said detected run in accordance with said accumulated discard number, incrementing said code counter to a next following code, and continuing said method with a next data character of said input stream following said discarded data characters.

25. The method of claim 24 wherein said predetermined number of said adjacent data characters comprises three data characters.

26. The method of claim 19 wherein said first equation comprises $$n=\text{Integer Part of } [((8R+1)^{1/2}-1)/2]$$

where n is said number of contiguous segments included in said detected run and R is said representative number, said second equation comprises $$L=[(\text{code}+n)-1]$$

where L is said limit and code is said code in said code counter, and said third equation comprises $$T=[(n(n+1))/2]$$

where T is said discard number.

27. The method of claim 19 wherein said steps of mathematically determining and outputting further include initializing an accumulated discard number, and increasing said accumulated discard number by said discard number computed by said third computation.

28. The method of claim 27 further including discarding data characters of said detected run in accordance with said accumulated discard number, incrementing said code counter to a next following code, and continuing said method with a next data character of said input stream following said discarded data characters.

29. The method of claim 7 wherein said predetermined number of said adjacent data characters comprises three data characters.

30. Data compression apparatus for compressing an input stream of data characters into an output stream of compressed codes, said apparatus including an LZW data compressor, said LZW data compressor including a dictionary for storing strings of data characters, a code counter for assigning respective codes to said stored strings and means for incrementing said code counter for each said stored string, said apparatus comprising:

means for detecting when a run of data characters is occurring in said input stream by detecting when a predetermined number of adjacent data characters of said input stream are the same with respect to each other, said detected run including contiguous numerically increasing segments, a segment having one data character less than the next following adjacent segment of said detected run, means for determining consecutive codes from said code counter to correspond, respectively, to said contiguous segments of said detected run, said LZW data compressor operative to compress said input stream when a run is not detected occurring therein by comparing said input stream to said stored strings to determine longest matches therewith and providing said codes assigned thereto, thereby providing LZW compressed codes, and means for outputting the data character of said detected run and said consecutive codes corresponding to said contiguous segments and for outputting said LZW compressed codes so as to provide said output stream.

31. The apparatus of claim 30 wherein said determining means comprises means for looking ahead in said input stream when said run is detected to detect said contiguous numerically increasing segments that exist in said run, and means for assigning said consecutive codes from said code counter to said detected contiguous segments, respectively.

32. The apparatus of claim 31 wherein said detected run includes a last segment having one data character more than the prior adjacent segment of said detected run, further including means for detecting that said input stream following said last segment contains an insufficient number of adjacent data characters that are the same as the data character of said detected run to populate a next following adjacent segment, and means for incrementing said code counter to a next following code after said insufficient number of data characters has been detected.

33. The apparatus of claim 32 further including means for discarding the data characters of each said segment of said detected run for which an assigned code is outputted.

34. The apparatus of claim 33 further including means for fetching the next data character of said input stream following said discarded data characters to continue said compressing of said input stream.

35. The apparatus of claim 30 wherein said predetermined number of said adjacent data characters comprises three data characters.

36. The apparatus of claim 30 wherein said determining means comprises means for determining a number representative of the number of data characters in said detected run, and means for mathematically determining, by a mathematical algorithm using said representative number, said consecutive codes from said code counter that correspond, respectively, to said contiguous segments of said detected run.

37. The apparatus of claim 36 wherein said detected run includes further data characters following said contiguous segments, said further data characters forming a run including further contiguous numerically increasing segments, said apparatus further including means for outputting the data character of said detected run, means for incrementing said code counter to a next following code, means for recursively utilizing said mathematical algorithm, using said number of further data characters, to mathematically determine further consecutive codes from said code counter corresponding, respectively, to said further contiguous segments, and means for outputting said further consecutive codes.

38. The apparatus of claim 36 wherein said means for mathematically determining and said means for outputting comprise iterative means for performing the operations of initializing an index denoting the number of data characters in a segment, outputting the code in said code counter and incrementing said code counter to a next following code, diminishing said representative number by subtracting said index therefrom, incrementing said index by one, comparing said diminished representative number to said incremented index, and repeating the above given operations from outputting said code in said code counter through comparing said diminished representative number to said incremented index until said diminished representative number is less than said incremented index.

39. The apparatus of claim 38 further including recursive means for performing the following operations when said diminished representative number is less than said incremented index but not less than three incrementing said code counter to a next following code, outputting said data character of said detected run, re-initializing said index, and repeating said operations of outputting said code in said code counter through comparing said diminished representative number to said incremented index until said diminished representative number is less than said incremented index.

40. The apparatus of claim 39 wherein said recursive means further includes means for decrementing said diminished representative number by one.

41. The apparatus of claim 36 further including means for discarding the data characters of said segments of said detected run for which corresponding codes are outputted, means for incrementing said code counter to a next following code, and means for fetching the next data character of said input stream following said discarded data characters to continue said compressing of said input stream.

42. The apparatus of claim 36 wherein said means for mathematically determining and said means for outputting comprise iterative means for performing the operations of initializing an index denoting the number of data characters in a segment, initializing a discard number, outputting the code in said code counter and incrementing said code counter to a next following code, increasing said discard number by adding said index thereto, diminishing said representative number by subtracting said index therefrom, incrementing said index by one, comparing said diminished representative number to said incremented index, and repeating the above given operations from outputting said code in said code counter through comparing said diminished representative number to said incremented index until said diminished representative number is less than said incremented index, said apparatus further including means for discarding data characters of said detected run in accordance with said discard number, means for incrementing said code counter to a next following code, and means for fetching the next data character of said input stream following said discarded data characters to continue said compressing of said input stream.

43. The apparatus of claim 42 further including recursive means for performing the following operations when said diminished representative number is less than said incremented index but not less than three incrementing said code counter to a next following code, outputting said data character of said detected run, re-initializing said index, and repeating said operations of outputting said code in said code counter through comparing said diminished representative number to said incremented index until said diminished representative number is less than said incremented index.

44. The apparatus of claim 43 wherein said recursive means further includes means for decrementing said diminished representative number by one.

45. The apparatus of claim 44 further including means for incrementing said discard number by one.

46. The apparatus of claim 44 wherein said predetermined number of said adjacent data characters comprises three data characters.

47. The apparatus of claim 36 wherein said means for mathematically determining and said means for outputting comprise mathematical equation means for performing the operations of a first computation, using a first equation, computing the number of said contiguous numerically increasing segments included in said detected run in terms of said representative number, a second computation computing a limit using a second equation that includes adding said number of said contiguous segments to the code in said code counter, and outputting said code in said code counter and incrementing said code counter to a next following code until said next following code is equal to said limit.

48. The apparatus of claim 47 wherein said mathematical equation means is further operative for performing the operation of a third computation, using a third equation, computing a discard number in terms of the number computed in said first computation.

49. The apparatus of claim 48 further including recursive means for performing the following operations when said next following code is equal to said limit diminishing said representative number by said discard number and performing the following operations when said diminished representative number if not less than three, outputting the data character of said detected run, incrementing said code counter to a next following code, using said diminished representative number in said first equation to re-compute said first computation, re-computing said limit using said second equation applied to the result of said re-computed first computation, and outputting the code in said code counter and incrementing said code counter to a next following code until said next following code is equal to said re-computed limit.

50. The apparatus of claim 49 wherein said recursive means further includes means for re-computing said discard number using said third equation applied to the result of said re-computed first computation.

51. The apparatus of claim 50 wherein said mathematical equation means further includes means for initializing an accumulated discard number, and means for increasing said accumulated discard number by said discard number and said re-computed discard number.

52. The apparatus of claim 51 wherein said mathematical equation means is operative to increment said accumulated discard number by one when said next following code is equal to said limit and said diminished representative number is not less than three.

53. The apparatus of claim 52 further including means for discarding data characters of said detected run in accordance with said accumulated discard number, means for incrementing said code counter to a next following code, and means for fetching the next data character of said input stream following said discarded data characters to continue said compressing of said input stream.

54. The apparatus of claim 53 wherein said predetermined number of said adjacent data characters comprises three data characters.

55. The apparatus of claim 48 wherein said first equation comprises $$n = \text{Integer Part of } [((8R+1)^{1/2}-1)/2]$$

where n is said number of contiguous segments included in said detected run and R is said representative number, said second equation comprises $$L = [(\text{code}+n)-1]$$

where L is said limit and code is said code in said code counter, and $$T = [(n(n+1))/2]$$

where T is said discard number.

56. The apparatus of claim 48 wherein said mathematical equation means further includes means for initializing an accumulated discard number, and means for increasing said accumulated discard number by said discard number computed by said third computation.

57. The apparatus of claim 56 further including means for discarding data characters of said detected run in accordance with said accumulated discard number, means for incrementing said code counter to a next following code, and means for fetching the next data character of said input stream following said discarded data characters to continue said compressing of said input stream.

58. The apparatus of claim 36 wherein said predetermined number of said adjacent data characters comprises three data characters.

* * * * *